(12) United States Patent
Sung et al.

(10) Patent No.: US 9,691,618 B2
(45) Date of Patent: Jun. 27, 2017

(54) METHODS OF FABRICATING SEMICONDUCTOR DEVICES INCLUDING PERFORMING AN ATOMIC LAYER ETCHING PROCESS

(71) Applicant: SAMSUNG ELECTRONICS CO., LTD., Suwon-si, Gyeonggi-do (KR)

(72) Inventors: Dougyong Sung, Seoul (KR); Sejin Oh, Hwaseong-si (KR); Je-Hun Woo, Suwon-si (KR); Hyunju Lee, Hwaseong-si (KR); Seungkyu Lim, Uiwang-si (KR); Kiho Hwang, Seoul (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 0 days.

(21) Appl. No.: 14/940,184

(22) Filed: Nov. 13, 2015

(65) Prior Publication Data

US 2017/0140937 A1    May 18, 2017

(51) Int. Cl.
  *H01L 21/26*    (2006.01)
  *H01L 21/263*   (2006.01)
  *H01L 21/683*   (2006.01)
  *H01L 21/66*    (2006.01)

(52) U.S. Cl.
  CPC ...... *H01L 21/2633* (2013.01); *H01L 21/6831* (2013.01); *H01L 22/26* (2013.01)

(58) Field of Classification Search
  CPC .. H01L 21/2633; H01L 21/6831; H01L 22/26
  See application file for complete search history.

(56) References Cited

U.S. PATENT DOCUMENTS

| 6,573,731 B1* | 6/2003 | Verdeyen ......... H01J 37/32266 156/345.28 |
| 6,874,443 B2 | 4/2005 | Yeom et al. |
| 8,617,411 B2 | 12/2013 | Singh |

(Continued)

FOREIGN PATENT DOCUMENTS

JP    2003-045846 A    2/2003

OTHER PUBLICATIONS

Kanarik, et al., "Moving Atomic Layer Etch from Lab to Fab" Solid State Technology, p. 14-17, Dec. 2013.

*Primary Examiner* — Duy Deo
*Assistant Examiner* — Mahmoud Dahimene
(74) *Attorney, Agent, or Firm* — Lee & Morse, P.C.

(57) ABSTRACT

Provided are a semiconductor device fabricating apparatus configured to perform an atomic layer etching process and a method of fabricating a semiconductor device including performing the atomic layer etching process. The method includes loading a wafer onto an electrostatic chuck in a chamber, performing a first periodical process in which a first gas is supplied to an inside of the chamber and the first gas is adsorbed onto the wafer, performing a second periodical process in which a second gas is supplied to the inside of the chamber and the first gas remaining in the chamber is exhausted to an outside of the chamber, performing a third periodical process in which a third gas is supplied to the inside of the chamber, plasma including the third gas is generated, the plasma collides with the wafer, and the first gas adsorbed onto the wafer is removed, and unloading the wafer to the outside of the chamber.

13 Claims, 2 Drawing Sheets

(56) References Cited

U.S. PATENT DOCUMENTS

| | | | |
|---|---|---|---|
| 9,159,599 B2* | 10/2015 | Ansell | H01L 21/67253 |
| 2005/0034811 A1* | 2/2005 | Mahoney | H01J 37/32954 |
| | | | 156/345.24 |
| 2010/0151599 A1* | 6/2010 | Bai | H01L 22/26 |
| | | | 438/17 |
| 2012/0095586 A1* | 4/2012 | Chen | H01J 37/32926 |
| | | | 700/110 |
| 2015/0118858 A1 | 4/2015 | Takaba | |
| 2016/0203995 A1* | 7/2016 | Kanarik | H01L 21/0228 |
| | | | 438/703 |

* cited by examiner

METHODS OF FABRICATING SEMICONDUCTOR DEVICES INCLUDING PERFORMING AN ATOMIC LAYER ETCHING PROCESS

BACKGROUND

1. Field

Embodiments relate to a semiconductor device fabricating apparatus configured to perform an atomic layer etching (ALE) process and methods of fabricating semiconductor devices including performing the atomic layer etching process.

2. Description of Related Art

With the increase of degree of integration of semiconductor devices, research on methods of finely patterning and forming semiconductor patterns has been progressing. An atomic layer etching process is a technique for finely forming the semiconductor patterns by etching a material layer in units of atomic layers.

SUMMARY

Embodiments may be realized by providing a method of fabricating a semiconductor device, including loading a wafer onto an electrostatic chuck in a chamber; performing a first periodical process in which a first gas is supplied to an inside of the chamber and the first gas is adsorbed onto the wafer; performing a second periodical process in which a second gas is supplied to the inside of the chamber and the first gas remaining in the chamber is exhausted to an outside of the chamber; performing a third periodical process in which a third gas is supplied to the inside of the chamber, plasma including the third gas is generated, the plasma collides with the wafer, and the first gas adsorbed onto the wafer is removed; and unloading the wafer to the outside of the chamber.

The first gas may include a gas containing a halogen element; the second gas may include an inert gas; and the third gas may include argon.

The first periodical process may further include supplying the first gas to the inside of the chamber using gas supply elements; exhausting the first gas not adsorbed onto the wafer to the outside of the chamber using gas exhausting elements; converting some of the exhausted first gas into a plasma state using a self-plasma optical emission spectroscope and measuring an optical emission spectral characteristic of the converted first gas; and correcting a flow rate of the first gas among process conditions of the first periodical process with reference to the measured optical emission spectral characteristic of the first gas.

The second periodical process may include supplying the second gas to the inside of the chamber using gas supply elements; and at a same time, exhausting the first gas remaining in the chamber to the outside of the chamber using gas exhausting elements.

The third periodical process may further include measuring photon flux of the inside of the chamber using a vacuum ultraviolet sensor; and correcting sputtering pressure among process conditions of the third periodical process with reference to the measured photon flux.

The third periodical process may further include measuring a bias voltage and current of the inside of the chamber using a voltage/current probe; and correcting sputtering time among process conditions of the third periodical process with reference to the measured bias voltage and current.

The third periodical process may further include measuring electron density in the chamber using a microwave absorption probe; and correcting sputtering source power among process conditions of the third periodical process with reference to the measured electron density.

The method may further include supplying a cleaning gas into the chamber and cleaning the inside of the chamber by performing a cleaning process. The cleaning process may further include measuring particles in the chamber using a quartz crystal microbalance and determining a cleaning end point.

A space in the chamber, into which the first to third gases are supplied, may be a same as a space in which plasma is generated.

Embodiments may be realized by providing a method of fabricating a semiconductor device, including loading a wafer on an electrostatic chuck in a chamber; applying vacuum to an inside of the chamber; supplying a first gas into the inside of the chamber using gas supply elements and adsorbing the first gas onto the wafer; supplying a second gas into the inside of the chamber using the gas supply elements and exhausting the first gas which is not adsorbed onto the wafer and remaining in the chamber to an outside of the chamber using gas exhausting elements; supplying a third gas into the inside of the chamber using the gas supply elements, generating plasma including the third gas, etching the first gas adsorbed onto the wafer by performing a sputtering process in which the plasma collides with the wafer, and exhausting the etched first gas to the outside of the chamber using the gas exhausting elements; and unloading the wafer.

The plasma may be inductively coupled plasma generated by coils mounted above the chamber; the coils may include an inner coil and an outer coil that are coupled to each other; and a space in the chamber, into which the first to third gases are supplied, may be a same as a space in which the plasma is generated.

The method may further include converting the exhausted first gas into a plasma state using a self-plasma optical emission spectroscope on one side portion of the gas exhausting elements, the self-plasma optical emission spectroscope measuring an optical emission spectral characteristic of the converted first gas; and correcting a flow rate of the first gas with reference to the measured optical emission spectral characteristic of the first gas.

The method may further include measuring photon flux in the chamber using a vacuum ultraviolet sensor on one side wall of the chamber; and correcting sputtering pressure of the sputtering process with reference to the measured photon flux.

The method may further include measuring a bias voltage and bias current using a voltage/current probe under the electrostatic chuck; and correcting performing time of the sputtering process with reference to the measured bias voltage and bias current.

The method may further include measuring electron density in the chamber using a microwave absorption probe on one side wall of the chamber; and correcting source power of the sputtering process with reference to the measured electron density.

Embodiments may be realized by providing a method of fabricating a semiconductor device, including providing a semiconductor device fabricating apparatus including a chamber, plasma source elements above the chamber, the plasma source elements forming plasma in a plasma space in the chamber, gas supply elements which directly supply gases in the plasma space in the chamber, an electrostatic chuck in an inside of the chamber, bias elements under the electrostatic chuck, and gas exhausting elements under the chamber, loading a wafer onto the electrostatic chuck, performing a first process including supplying a first gas into the plasma space using the gas supply elements and adsorbing the first gas onto the wafer, performing a second process including supplying a second gas into the plasma space using the gas supply elements and exhausting the first gas remaining in the chamber to an outside of the chamber using the gas exhausting elements, performing a third process including supplying a third gas into the plasma space using the gas supply elements, forming plasma in the plasma space using the plasma source elements, colliding the plasma with the wafer using the bias elements by performing a sputtering process, separating the first gas adsorbed on the wafer from the wafer, and exhausting the separated first gas to the outside of the chamber using the gas exhausting elements, and unloading the wafer to the outside of the chamber.

The method may further include analyzing information on the first process, information on the second process, and information on the third process, and modifying and correcting process conditions of the first process, the process conditions of the second process, and the process conditions of the third process.

The process conditions of the first process may include one or more of supply flow rate of the first gas or a temperature of the electrostatic chuck.

The process conditions of the second process may include one or more of supply flow rate of the second gas or a temperature of the electrostatic chuck.

The process conditions of the third process may include one or more of supply flow rate of the third gas, plasma power of the sputtering process, sputtering pressure of the sputtering process, processing time of the sputtering process, bias power of the sputtering process, source power of the sputtering process, or a temperature of the electrostatic chuck.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
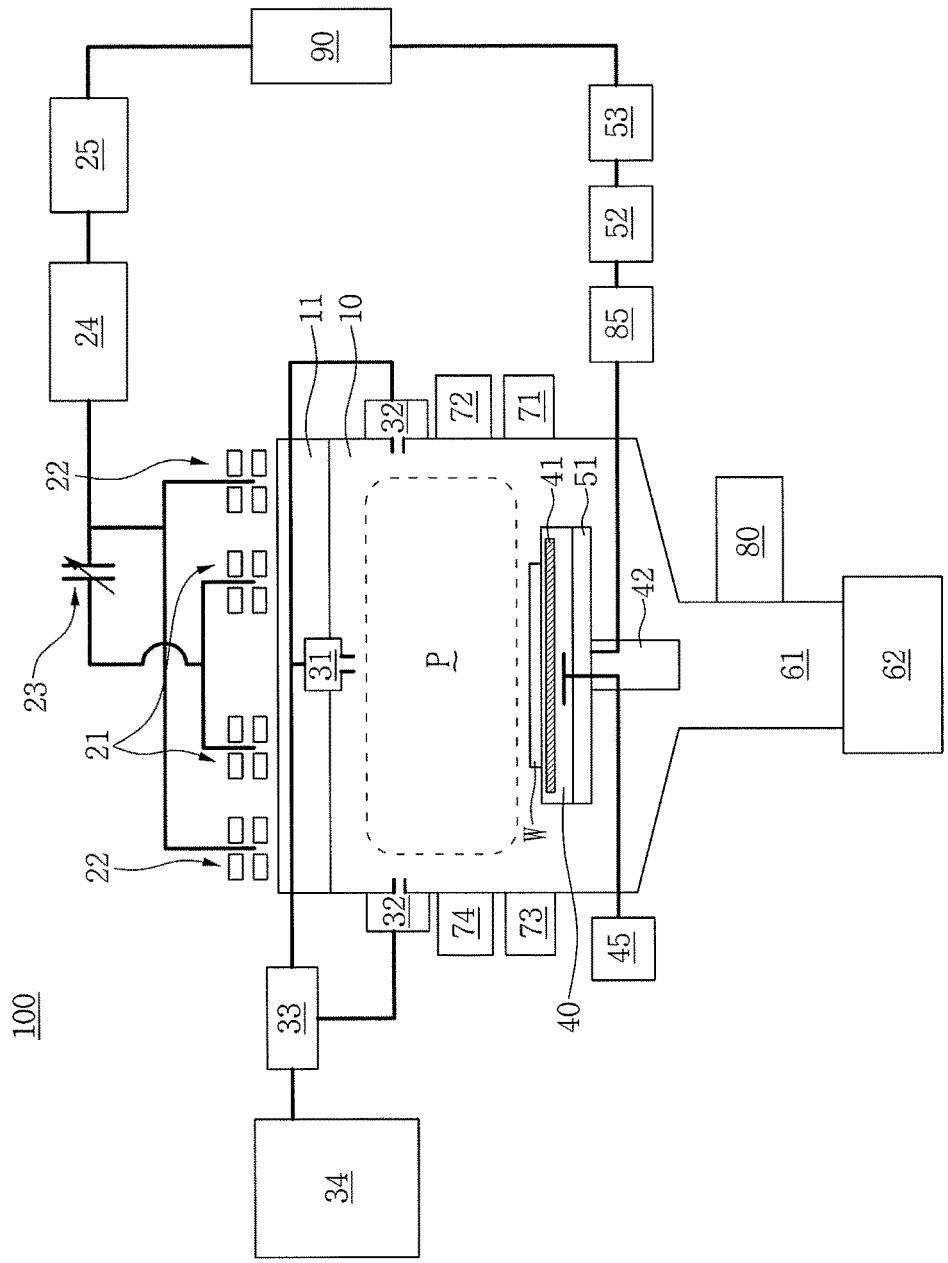
FIG. 1 illustrates a conceptual longitudinal sectional view of a semiconductor device fabricating apparatus in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Spatially relative terms, such as "below," "beneath," "lower," "above," "upper," and the like, may be used herein for ease of description in describing one element's or feature's relationship to another/other element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

The exemplary embodiments will be described with reference to cross-sectional views and/or plan views, which are ideal exemplary views. Thicknesses of layers and areas are exaggerated for effective description of the technical contents in the drawings. Therefore, forms of the embodiments may be modified by the manufacturing technology and/or tolerance.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

FIG. 1 illustrates a conceptual longitudinal sectional view of a semiconductor device fabricating apparatus 100 in accordance with an embodiment. Referring to FIG. 1, the semiconductor device fabricating apparatus 100 in accordance with an embodiment may include a chamber 10, plasma source elements 21 to 25, gas supply elements 31 to 34, an electrostatic chuck 40, bias elements 51 to 53, and gas exhausting elements 61 and 62.

The chamber 10 may maintain a vacuum state. The chamber 10 may further include a cover 11 which covers an upper portion of the chamber 10. The cover 11 may close the upper portion of the chamber 10.

The plasma source elements 21 to 25 may be disposed on the cover 11. The plasma source elements 21 to 25 may include coils 21 and 22, a source RF (radio frequency) matching unit 24, and a source RF generating unit 25. The coils 21 and 22 may include an inner coil 21 and an outer coil 22. The inner coil 21 and the outer coil 22 each may have a spiral shape or a concentric shape. One ends of the inner coil 21 and the outer coil 22 may be decoupled from each other using a variable capacitor 23 and the other ends thereof may be grounded, and the inner coil 21 and the outer coil 22 may have phases and magnetic fields opposite to each other. Alternatively, the inner coil 21 and the outer coil 22 may maintain the same potential difference as each other in a direct current state. The coils 21 and 22 may generate inductively coupled plasma in a plasma space P of the chamber 10. The coils 21 and 22 may be coupled to the source RF matching unit 24 and the source RF generating unit 25. The source RF generating unit 25 may generate an RF signal. For example, the RF signal may have a frequency of about 13.56 MHz. The source RF matching unit 24 may match impedance of the RF signal generated in the source RF generating unit 25 to control the plasma to be generated using the coils 21 and 22.

The gas supply elements 31 to 34 may include gas supply pipes 31 and 32, a flow rate controller 33, and a gas supply unit 34. The gas supply pipes 31 and 32 may supply various gases through the upper portion and/or side surfaces of the chamber 10. For example, the gas supply pipes 31 and 32 may include a vertical gas supply pipe 31 passing through the cover 11 and/or a horizontal gas supply pipes 32 passing through the side surfaces of the chamber 10. The vertical gas supply pipe 31 and the horizontal gas supply pipe 32 may directly supply the gases to the plasma space P in the chamber 10. In an embodiment, the plurality of horizontal gas supply pipe 32 may be provided. The various gases may include a first gas including an adsorption gas, a second gas including a purge gas, a third gas including a bombarding gas, and/or a cleaning gas. For example, the first gas may include one or more gases among a $C_xF_y$ gas such as $CF_4$ or $C_2F_6$, a $C_xH_yF_x$ gas such as $CHF_3$ or $CH_2F_2$, and gases including a halogen element such as $Cl_2$, $BCl_3$, HCl, $SF_6$, or HBr. The second gas may include any one of argon (Ar) gas, helium (He) gas, neon (Ne) gas, and xenon (Xe) gas. The third gas may include argon (Ar) gas. The cleaning gas may include $NF_3$ or $O_2$ gas. The flow rate controller 33 may control supply flow rates of the gases introduced into an inside of the chamber 10 through the gas supply pipes 31 and 32. The gas supply unit 34 may store the first gas, the second gas, and the third gas, and may supply the gases to the gas supply pipes 31 and 32. In an embodiment, the flow rate controller 33 may individually or commonly control the supply flow rates of the gases supplied to each of the vertical gas supply pipe 31 and the horizontal gas supply pipe 32. For example, the gas supply unit 34 may include a plurality of gas tanks and a plurality of mass flow controllers (MFCs) corresponding to the respective gas tanks. The MFCs may individually control each of the supply flow rates of the gases.

In the chamber 10 of the semiconductor device fabricating apparatus 100 in accordance with an embodiment, a space into which the gases are supplied and a space in which the gases are converted into a plasma state may be the same as each other. For example, the space into which the gases are supplied and the space in which plasma is generated may not be separated from each other, and may be the same as each other in the chamber 10. The gases may be directly supplied and injected to the plasma space P, and plasma generation efficiency may be improved.

A wafer W may be placed on the electrostatic chuck 40. The electrostatic chuck 40 may include a temperature adjusting unit 41 therein. The temperature adjusting unit 41 may include a heater and/or a cooler to adjust a temperature of the electrostatic chuck 40. The temperature adjusting unit 41 may include a heating coil and/or a cooling pipe in which a coolant flows. The electrostatic chuck 40 may be supported by the supporting unit 42 to rotate.

The bias elements 51 to 53 may attract the converted third gas into a plasma state and collide with the wafer W. The bias elements 51 to 53 may include an electrode plate 51, a bias RF matching unit 52, and a bias RF generating unit 53. The electrode plate 51 may attract plasma atoms or ions generated in the chamber 10. The bias RF matching unit 52 may adjust a bias voltage and bias current, which are applied to the electrode plate 51, to match impedance of a bias RF. The bias RF generating unit 53 may generate an RF signal. For example, the RF signal may have a frequency of about 13.56 MHz. The bias RF generating unit 53 and the source RF generating unit 25 may be synchronized or may not be synchronized with each other through a tuner 90.

The gas exhausting elements 61 and 62 may include a gas exhausting pipe 61 and a gas exhausting pump 62. The gas exhausting pump 62 may exhausting the gases in the inside of the chamber 10 to the outside thereof through the gas exhausting pipe 61. For example, the gas exhausting pump 62 may include a turbo pump and/or a molecular pump.

The semiconductor device fabricating apparatus 100 may include a self-plasma optical emission spectroscope (SPOES) 80 disposed on one side portion of the gas exhausting pipe 61. The SPOES 80 may collect and convert some of the gases exhausted through the gas exhausting pipe 61 into a plasma state, and measure optical emission spectral characteristics of the converted gases. Various characteristics of the gases exhausted through the gas exhausting pipe 61 may be analyzed from the optical emission spectral characteristics of the converted gases, which are measured and monitored using the SPOES 80. For example, information on quantitative and qualitative characteristics of the exhausted gases, and an amount of etching of the wafer W may be obtained. The measured optical emission spectral characteristics of the converted gases may be used to monitor and estimate, for example, the supply flow rates of the gases and processing time.

The semiconductor device fabricating apparatus 100 may include a vacuum ultraviolet (VUV) sensor 72 disposed on one side wall of the chamber 10. VUV may include ultraviolet light having a wavelength of about 200 nm or less. The VUV sensor 72 may measure photon flux of the inside of the chamber 10. The measured photon flux may be used to measure and monitor sputtering pressure in a plasma sputtering process performed in the chamber 10.

The semiconductor device fabricating apparatus 100 may further include a voltage/current (VI) probe 85 connected to the electrode plate 51. The VI probe 85 may measure a voltage, current, and power, which are applied from the bias elements 51 to 53 to the electrostatic chuck 40. For example, the voltage, current, and power measured by the VI probe 85 may be used to measure and monitor the adequacy of the sputtering time and/or source power in the plasma sputtering process performed in the chamber 10.

The semiconductor device fabricating apparatus 100 may further include an optical emission spectroscope (OES) 71 disposed on the side wall of the chamber 10. The OES 71 may be used to measure and monitor optical emission spectral characteristics of materials contained in the gases in the inside of the chamber 10. For example, the OES 71 may be used to analyze light generated by a material exposed onto the wafer W or an etched and separated material from the wafer W and to determine an etching state of the wafer W. The OES 71 may be used to detect an end point of the plasma sputtering process performed in the chamber 10.

The semiconductor device fabricating apparatus 100 may further include a microwave absorption probe (MAP) 73 disposed on the side wall of the chamber 10. The MAP 73 may measure electron density in the chamber 10. For example, the MAP 73 may be used to measure electron density in the plasma sputtering process performed in the chamber 10 and to control sputtering source power.

The semiconductor device fabricating apparatus 100 may further include a quartz crystal microbalance (QCM) 74 disposed on the side wall of the chamber 10. The quartz crystal microbalance 74 may be used to measure and analyze particles of the chamber 10 and to determine, for example, a cleaning cycle or cleaning time. Vibration frequencies of the quartz crystal microbalance 74 may be changed according to thicknesses or mass of the particles adsorbed onto a window, the increase or decrease in the thicknesses or mass of the particles adsorbed on the window of the quartz crystal microbalance 74 may be determined by detecting the change of the number of vibrations of the quartz crystal microbalance 74, and an optimal end point of a cleaning process may be determined at an inflection point in which the number of vibrations is not shifted anymore.

The semiconductor device fabricating apparatus 100 may further include a temperature sensor 45 disposed on an inner wall of the chamber 10 or inside or under the electrostatic chuck 40. The temperature sensor 45 may be used to measure and monitor the temperature of the electrostatic chuck 40 or the wafer W placed on the electrostatic chuck 40.

Figure 2:
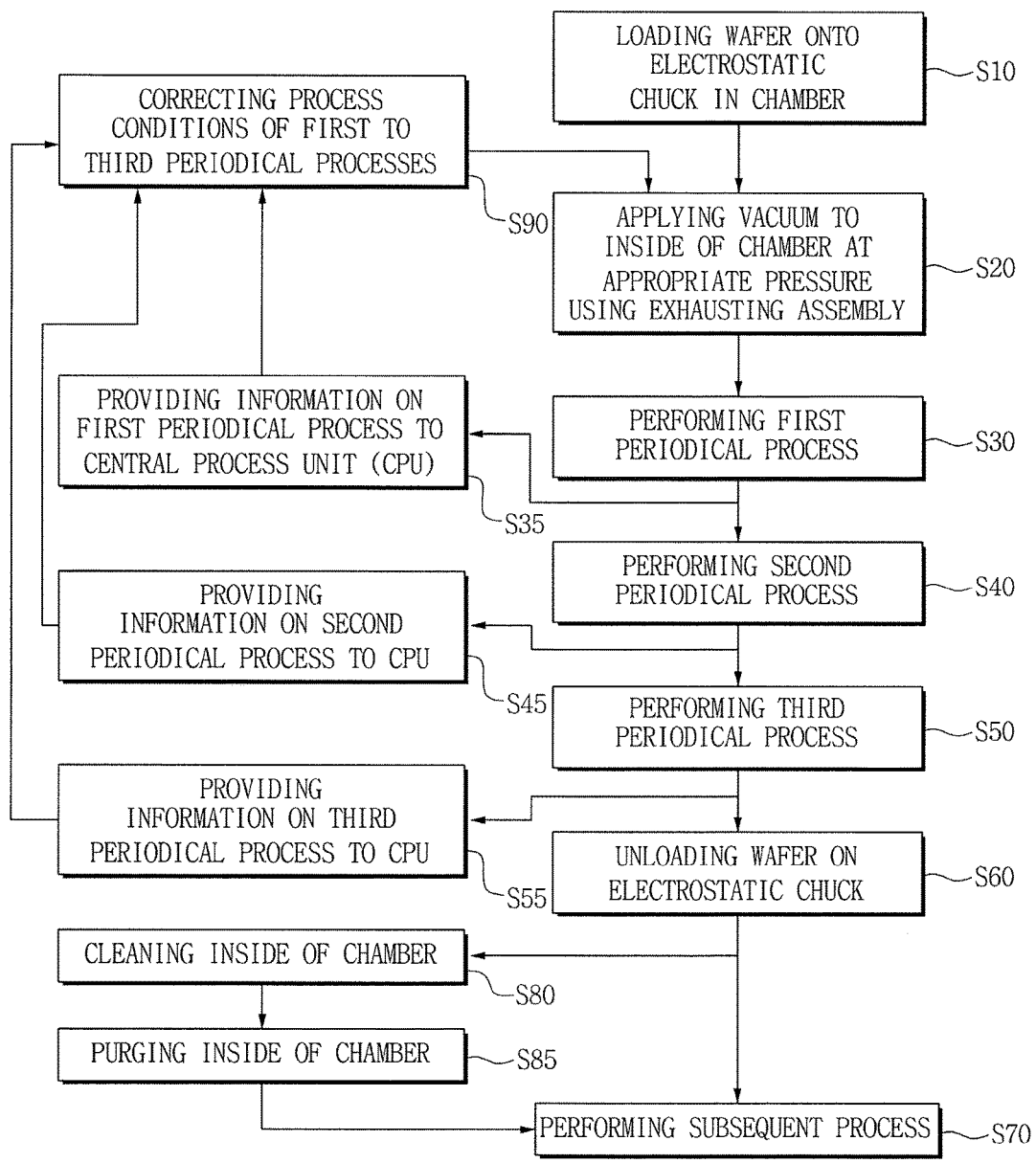
FIG. 2 illustrates a flowchart for describing a method of fabricating a semiconductor device in accordance with an embodiment.

FIG. 2 illustrates a flowchart for describing a method of fabricating a semiconductor device in accordance with an embodiment. For example, the method may include an atomic layer etching process and a method of performing the atomic layer etching process.

Referring to FIGS. 1 and 2, the method of fabricating the semiconductor device in accordance with an embodiment may include loading the wafer W onto the electrostatic chuck 40 in the chamber 10 of the semiconductor device fabricating apparatus 100 (S10).

The method may include vacuuming, e.g., applying vacuum to, the inside of the chamber 10 at appropriate pressure using the gas exhausting elements 61 and 62 (S20). For example, the method may include exhausting, for example, air and the remaining gas, in the inside of the chamber 10 using the gas exhausting pump 62.

The method may include performing a first periodical process (S30). The first periodical process may include supplying a first gas into the chamber 10, and adsorbing the first gas onto a surface of the wafer W. The first gas may be adsorbed onto the surface of the wafer W, and may include one or more gases among a $C_xF_y$ gas such as $CF_4$ or $C_2F_6$, a $C_xH_yF_x$ gas such as $CHF_3$ or $CH_2F_2$, and gases including a halogen element such as $Cl_2$, $BCl_3$, $HCl$, $SF_6$, $HBr$, or $NF_3$. The first gas may be supplied through the gas supply elements 31 to 34. For example, the first gas may pass through the flow rate controller 33 from the gas supply unit 34, and may be directly supplied to the plasma space P of the chamber 10 through the vertical gas supply pipe 31 and/or the horizontal gas supply pipe 32. An etching target layer to be etched by the first gas may be formed on the surface of the wafer W. For example, the etching target layer may include one of silicon oxide, silicon nitride, and silicon oxynitride.

The first periodical process may include continuously exhausting the first gas which is not adsorbed on the surface of the wafer W using the gas exhausting elements 61 and 62. The first periodical process may include supplying the first gas to the inside of the chamber 10 and at the same time exhausting the first gas to the outside of the chamber 10, and the inside of the chamber 10 may be maintained in a vacuum pressure state.

At the same time, the first periodical process may include collecting and converting some of the first gas exhausted through the gas exhausting pipe 61 into a plasma state using the SPOES 80, and measuring and monitoring an optical emission spectral characteristic of the converted first gas. The first periodical process may include measuring, monitoring, and controlling temperatures of the inside of the chamber 10, the electrostatic chuck 40, and/or the wafer W using the temperature sensor 45.

The method may include providing information on the first periodical process such as the measured and monitored optical emission spectral characteristic of the first gas, and the measured and monitored temperatures of the inside of the chamber 10, the electrostatic chuck 40, and/or the wafer W to a central processing unit (CPU) of the semiconductor device fabricating apparatus 100 (S35). The measured and monitored optical emission spectral characteristic of the first gas may provide information on, for example, flow and a supply flow rate of the first gas.

The method may include performing a second periodical process (S40). The second periodical process may include supplying a second gas into the inside of the chamber 10. The second gas may include an inert gas such as argon (Ar). In the second periodical process, the first gas which is not adsorbed on the surface of the wafer W may be exhausted to the outside of the chamber 10 by the second gas and the inside of the chamber 10 may be purged. The second periodical process may include continuously exhausting the second gas using the gas exhausting elements 61 and 62, and the inside of the chamber 10 may be maintained in a vacuum pressure state.

The second periodical process may include collecting some of the exhausted second gas using the SPOES 80 and measuring and monitoring an optical emission spectral characteristic of the second gas. For example, whether the inside of the chamber 10 is fully purged or not may be monitored. The second periodical process may include measuring, monitoring, and controlling the temperatures of the inside of the chamber 10, the electrostatic chuck 40, and/or the wafer W.

The method may include providing information on the second periodical process such as, for example, the measured and monitored optical emission spectral characteristic of the second gas or the measured and monitored temperatures of the inside of the chamber 10, the electrostatic chuck 40, and/or the wafer W, to the CPU of the semiconductor device fabricating apparatus 100 (S45). The measured and monitored optical emission spectral characteristic of the second gas may provide information on, for example, flow and a supply flow rate of the second gas.

The method may include performing a third periodical process (S50). The third periodical process may include supplying a third gas to the inside of the chamber 10, converting into a plasma state, performing sputtering onto the surface of the wafer W, and etching the etching target material on the surface of the wafer W. For example, the third periodical process may include separating the etching target material from the surface of the wafer W using the converted third gas. The third gas may include a bombarding gas such as argon (Ar). The etching target material may include a chemical combination of the first gas adsorbed on the surface of the wafer W and a material present on the surface of the wafer W.

The plasma may be formed using the plasma source elements 21 to 25. For example, a magnet field induced by the current which flows to the coils 21 and 22 of the plasma source elements 21 to 25 may convert the third gas into a plasma state. The converted third gas may collide with the surface of the wafer W placed on the electrostatic chuck 40 by the bias elements 51 to 53. The third periodical process may include continuously exhausting the third gas and the etching target material separated from the surface of the wafer W using the gas exhausting elements 61 and 62, and the inside of the chamber 10 may be maintained in a vacuum pressure state.

The third periodical process may include measuring and monitoring photon flux in the inside of the chamber 10 using the VUV sensor 72. The measured and monitored photon flux may provide information on sputtering pressure of the sputtering process.

The third periodical process may include measuring and monitoring a voltage, current, and power, which are applied from the bias elements 51 to 53 to the electrode plate 51, using the VI probe 85. The measured and monitored voltage, current, and power, which are applied to the electrode plate 51, may provide information on performing time of the sputtering process.

The third periodical process may include measuring and monitoring electron density in the chamber 10 using the MAP 73. The measured and monitored electron density may provide information on source power of the sputtering process.

The third periodical process may include measuring and monitoring the optical emission spectral characteristic of the etching target material generated from the wafer W using the OES 71. The measured and monitored optical emission spectral characteristic of the etching target material may provide information on an end point of the sputtering process.

The third periodical process may include collecting the third gas exhausted through the gas exhausting elements 61 and 62 and some of the etched material and measuring and monitoring optical emission spectral characteristics using the SPOES 80. The measured and monitored optical emission spectral characteristics of the third gas and the etched material may provide various process conditions for the third gas and information on various process conditions of the sputtering process.

The third periodical process may include measuring, monitoring, and controlling temperatures of the inside of the chamber 10, the electrostatic chuck 40, and/or the wafer W using the temperature sensor 45.

The method may include providing information on the third periodical process such as the measured and monitored photon flux of the inside of the chamber 10, the measured and monitored voltage, current, and power applied to the electrode plate 51, the measured and monitored electron density of the inside of the chamber 10, the measured and monitored optical emission spectral characteristics of the third gas and the etched material of the inside of the chamber 10, the measured and monitored plasma optical emission spectral characteristic of the exhausting third gas and etched material, and/or the temperatures of the inside of the chamber 10, the electrostatic chuck 40, and/or the wafer W to the CPU of the semiconductor device fabricating apparatus 100 (S55).

The method may include repeating the first periodical process, the second periodical process, and the third periodical process. For example, the first to third periodical processes may be performed once, and may be repeated twice or more.

The method may include opening the chamber 10 and unloading the wafer W placed on the electrostatic chuck 40 (S60).

The method may include performing a subsequent process (S70). For example, the method may include loading the next wafer W onto the electrostatic chuck 40 of the chamber 10, and performing the first to third periodical processes.

The method may further include cleaning the inside of the chamber 10 by performing a cleaning process before the subsequent process is performed (S80). For example, the cleaning process may include supplying a cleaning gas to the inside of the chamber 10 using the gas supply elements 31 to 34 and/or exhausting the cleaning gas and residue of the inside of the chamber 10 using the gas exhausting elements 61 and 62. The cleaning gas may include a gas including a halogen element such as $NF_3$ and/or an oxidant gas such as $O_2$. The cleaning process may include measuring and monitoring the residue in the chamber 10 using the quartz crystal microbalance 74. Information on the measured residue may be provided to the CPU of the semiconductor device fabricating apparatus 100. The information on the residue may provide information on an end point of the cleaning process. The information on the residue may provide information on processing time of the cleaning process.

The method may further include purging the inside of the chamber 10 by performing a purge process after the cleaning process is performed (S85). For example, the purge process may include supplying a purge gas to the inside of the chamber 10 using the gas supply elements 31 to 34, and exhausting the remaining cleaning gas and the purge gas in the inside of the chamber 10 using the gas exhausting elements 61 and 62. Then, the method may include performing a subsequent process (S70).

The method may include analyzing the information on the first periodical process, the information on the second periodical process, and the information on the third periodical process, and modifying and correcting the process conditions of the first periodical process, the process conditions of the second periodical process, and the process conditions of the third periodical process using the CPU (S90). For example, the process conditions of the first periodical process such as, for example, the supply flow rate of the first gas and the temperature of the electrostatic chuck 40, the process conditions of the second periodical process such as, for example, the supply flow rate of the second gas and the temperature of the electrostatic chuck 40, and the process conditions of the third periodical process such as, for example, the supply flow rate of the third gas, the plasma power, the sputtering pressure of the sputtering process, the processing time of the sputtering process, the bias power of the sputtering process, the source power, and the temperature of the electrostatic chuck 40, may be corrected. A process recipe including the corrected process conditions may be applied to a subsequent process of processing the wafer W.

In the semiconductor device fabricating apparatus in accordance with an embodiment, a space to which gases are provided and a space in which plasma is formed may be the same as each other without being separated spatially. Therefore, since the gases are directly supplied and injected into the plasma space, plasma generation efficiency may be improved.

The method of fabricating the semiconductor device in accordance with an embodiment may include adsorbing an adsorption gas (an etching gas) onto the wafer by controlling an appropriate electrostatic chuck temperature, and then exhausting the adsorption gas (the etching gas) which is not adsorbed onto the wafer in the chamber of the semiconductor device fabricating apparatus to an outside of the chamber. Therefore, since the pure plasma is obtained, a process of removing the adsorption gas adsorbed onto the wafer may be effectively controlled.

The method of fabricating the semiconductor device in accordance with an embodiment may include monitoring the process in real time using various measuring devices, sensors, and probes, correcting process conditions, and applying to a subsequent process.

By way of summation and review, in order to finely and precisely etch, an ALE process may very finely etch an etching target layer, decrease damage to the etching target layer, and has attracted attention as a next-generation dry etching technique.

Provided is a method of fabricating a semiconductor device including supplying an adsorption gas (etching gas) into a chamber in order to optimize an ALE process, adsorbing the adsorption gas (etching gas) onto a wafer, supplying an inert gas into the chamber, purging the inside of the chamber, supplying argon gas into the chamber, generating plasma, colliding plasma ions with the wafer, and removing the adsorption gas and an etching target material, which are adsorbed onto the wafer.

Further, provided is a method of fabricating a semiconductor device including, during each process, e.g., operation, monitoring the process using various sensors such as a SPOES and a VUV sensor, a VI probe, a MAP, and a QCM, and correcting a recipe of a process of processing a next wafer.

Provided is a more minute and sophisticated ALE process and a method and apparatus of performing the ALE process. Embodiments provide a semiconductor device fabricating apparatus configured to perform an ALE process. Embodiments also provide a method of fabricating a semiconductor device by performing an ALE process.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, comprising:
   loading a wafer onto an electrostatic chuck in a chamber;
   performing a first periodical process in which a first gas is supplied to an inside of the chamber, a first portion of the first gas is adsorbed onto the wafer, a second portion of the first gas is exhausted to an outside of the chamber while the first gas is being supplied, and a third portion of the first gas is not adsorbed onto the wafer and remains in the chamber;
   performing a second periodical process in which a second gas is supplied to the inside of the chamber and the third portion of the first gas not adsorbed onto the wafer and remaining in the chamber is exhausted to an outside of the chamber;
   performing a third periodical process in which a third gas is supplied to the inside of the chamber, plasma including the third gas is generated, and a sputtering process is carried out in the third periodical process to collide the plasma with the wafer and to remove the first gas adsorbed onto the wafer; and
   unloading the wafer to the outside of the chamber,
   wherein the third periodical process further includes:
      measuring photon flux of the inside of the chamber using a vacuum ultraviolet sensor; and
      correcting a sputtering pressure among process conditions of the third periodical process with reference to the measured photon flux.

2. The method as claimed in claim 1, wherein:
   the first gas includes a gas containing a halogen element;
   the second gas includes an inert gas; and
   the third gas includes argon.

3. The method as claimed in claim 1, wherein the first periodical process further includes:
   during supplying the first gas to the inside of the chamber and exhausting the second portion of the first gas not adsorbed onto the wafer to the outside of the chamber, converting some of the exhausted first gas into a plasma state using a self-plasma optical emission spectroscope and measuring an optical emission spectral characteristic of the converted first gas; and
   correcting a flow rate of the first gas among process conditions of the first periodical process with reference to the measured optical emission spectral characteristic of the first gas.

4. The method as claimed in claim 1, wherein the second periodical process includes:
   supplying the second gas to the inside of the chamber using gas supply elements; and
   at a same time, exhausting the third portion of the first gas remaining in the chamber to the outside of the chamber using gas exhausting elements.

5. The method as claimed in claim 1, wherein the third periodical process further includes:
   measuring a bias voltage and current of the inside of the chamber using a voltage/current probe; and
   correcting sputtering time among process conditions of the third periodical process with reference to the measured bias voltage and current.

6. The method as claimed in claim 1, wherein the third periodical process further includes:
   measuring electron density in the chamber using a microwave absorption probe; and
   correcting sputtering source power among process conditions of the third periodical process with reference to the measured electron density.

7. The method as claimed in claim 1, further comprising supplying a cleaning gas into the chamber and cleaning the inside of the chamber by performing a cleaning process,
   wherein the cleaning process further includes measuring particles in the chamber using a quartz crystal microbalance and determining a cleaning end point.

8. The method as claimed in claim 1, wherein a space in the chamber, into which the first to third gases are supplied, is a same as a space in which plasma is generated.

9. A method of fabricating a semiconductor device, comprising:
   loading a wafer on an electrostatic chuck in a chamber;
   applying vacuum to an inside of the chamber;
   supplying a first gas into the inside of the chamber using gas supply elements, wherein during supplying the first gas, a first portion of the first gas is adsorbed onto the wafer, a second portion of the first gas is exhausted to an outside of the chamber using gas exhausting elements, and a third portion of the first gas is not adsorbed onto the wafer and remains in the chamber;
   supplying a second gas into the inside of the chamber using the gas supply elements and exhausting the second portion of first gas to an outside of the chamber using gas exhausting elements;
   supplying a third gas into the inside of the chamber using the gas supply elements, generating plasma including the third gas, etching the first portion of the first gas adsorbed onto the wafer by performing a sputtering process in which the plasma collides with the wafer, and exhausting the etched first portion of the first gas to the outside of the chamber using the gas exhausting elements;
   measuring photon flux in the chamber using a vacuum ultraviolet sensor on one side wall of the chamber;

correcting sputtering pressure of the sputtering process with reference to the measured photon flux; and unloading the wafer.

10. The method as claimed in claim 9, wherein:

the plasma is inductively coupled plasma generated by coils mounted above the chamber;

the coils includes an inner coil and an outer coil that are coupled to each other; and a space in the chamber, into which the first to third gases are supplied, is a same as a space in which the plasma is generated.

11. The method as claimed in claim 9, further comprising:

converting the exhausted second portion of the first gas into a plasma state using a self-plasma optical emission spectroscope on one side portion of the gas exhausting elements to provide a converted first gas, the self-plasma optical emission spectroscope measuring an optical emission spectral characteristic of the converted first gas; and correcting a flow rate of the first gas with reference to the measured optical emission spectral characteristic of the converted first gas.

12. The method as claimed in claim 9, further comprising:

measuring a bias voltage and bias current using a voltage/current probe under the electrostatic chuck; and correcting a performing time of the sputtering process with reference to the measured bias voltage and bias current.

13. The method as claimed in claim 9, further comprising:

measuring an electron density in the chamber using a microwave absorption probe on one side wall of the chamber; and correcting a source power of the sputtering process with reference to the measured electron density.

\* \* \* \* \*